(12) United States Patent
Lazarus et al.

(10) Patent No.: US 7,552,018 B1
(45) Date of Patent: Jun. 23, 2009

(54) METHOD FOR QUICKLY QUANTIFYING THE RESISTANCE OF A THIN FILM AS A FUNCTION OF FREQUENCY

(75) Inventors: Aaron D. Lazarus, Baltimore, MD (US); Wayne C. Jones, Catonsville, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 150 days.

(21) Appl. No.: 11/706,679

(22) Filed: Feb. 12, 2007

(51) Int. Cl.
*G01R 15/00* (2006.01)
*G01R 23/16* (2006.01)

(52) U.S. Cl. .................. 702/75; 324/752; 356/432; 428/336; 702/57

(58) Field of Classification Search .............. 702/38, 702/57, 75, 119; 324/719, 752, 753; 73/290 R; 356/432; 428/336
See application file for complete search history.

(56) References Cited

U.S. PATENT DOCUMENTS

| | | | |
|---|---|---|---|
| 4,360,564 A | 11/1982 | Philipp | |
| 6,054,868 A | 4/2000 | Borden et al. | |
| 6,675,645 B1 | 1/2004 | Pchelnikov | |
| 6,906,801 B2 | 6/2005 | Borden et al. | |
| 6,943,571 B2 | 9/2005 | Worledge | |
| 6,958,814 B2 | 10/2005 | Borden et al. | |
| 6,975,124 B2 | 12/2005 | Worledge | |
| 7,030,633 B1 | 4/2006 | Qiu et al. | |

OTHER PUBLICATIONS

Ming-Han John Lee and Richard J. Collier, "Sheet Resistance Measurement of Thin Metallic Films and Stripes at Both 130 Ghz and DC," IEEE Transactions on Instrumentation and Measurement, Vo. 54, No. 6, Dec. 2005, pp. 2412-2415.

R. J. Collier and D. G. Hasko, "Measurement of the Sheet Resistance of Resistive Films on Thin Substrates from 120 to 175 GHz Using Dielectric Waveguides," Journal of Applied Physics, vol. 91, No. 4, Feb. 15, 2002, pp. 2547-2549.

*Primary Examiner*—John H Le
(74) *Attorney, Agent, or Firm*—Howard Kaiser

(57) ABSTRACT

The present invention provides a baseline function, viz., a transmission-related parameter (transmission loss, transmission coefficient, etc.) as a function of resistance of a uniformly resistant finitely thin film—which is predicated on the theoretical behavior of electromagnetic radiation passing through a uniformly resistant infinitely thin film. This theoretical behavior is characterized by constancy of the transmission-related parameter for any frequency of the electromagnetic radiation, wherein each resistance value has associated therewith a constant transmission-related parameter. The baseline function is formed by calculating the constant transmission-related parameter value for each of plural resistance values in the theoretical model. The baseline function is correlated with an empirical function, viz., a transmission-related parameter as a function of frequency of the electromagnetic radiation—which is formed, in empirical testing, by measuring the transmission-related parameter value for each of plural resistance values. The correlation yields a functional relationship between resistance and frequency.

18 Claims, 6 Drawing Sheets

$R_A$ is Actual Resistance.

METHOD FOR QUICKLY QUANTIFYING THE RESISTANCE OF A THIN FILM AS A FUNCTION OF FREQUENCY

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to electromagnetic properties of layered materials (such as thin films situated upon substrates), more particularly to methods and apparatuses for determining the resistance of such materials.

Techniques are known for measuring reflection, transmission and absorption of electromagnetic radiation by an object (e.g., thin film) that is layered upon a substrate. Various approaches have been conventionally taken for quantifying these properties as a function of the frequency of the electromagnetic radiation that impinges upon the object.

In contrast, the quantification of the resistance of a thin film as a function of frequency has been problematical. Four-point probe and other methodologies are known for measuring the resistance of a thin film. Four-point probe methodology, however, only produces a single value at dc and does not manifest the effects of frequency. An inverse transform of transmission data has been used to quantify the resistance of a thin film as a function of frequency, but this methodology is complicated.

SUMMARY OF THE INVENTION

In view of the foregoing, it is an object of the present invention to provide a practical and efficient methodology for quantifying the resistance of a thin film as a function of frequency.

As typically embodied, the present invention provides a method for determining the resistance of a material layer in accordance with the frequency of electromagnetic radiation impinging thereon. The inventive method comprises: establishing a "reference relationship," which is a relationship between a transmission-related parameter (characterizing the electromagnetic radiation that passes through a uniformly resistant finitely thin material layer) and effective resistance (characterizing the uniformly resistant finitely thin material layer through which electromagnetic radiation passes); performing at least one measurement of a value of the transmission-related parameter for a value of the frequency (characterizing the electromagnetic radiation that passes through the uniformly resistant finitely thin material layer); and, based on the reference relationship and the at least one measurement, finding at least one solution of a value of the effective resistance for a value of the frequency (characterizing the electromagnetic radiation that passes through the uniformly resistant finitely thin material layer). The establishing of a reference relationship includes the calculating of a value of the transmission-related parameter for each of plural values of the effective resistance, wherein the effective resistance is assumed to be equivalent to the theoretical resistance of a uniformly resistant infinitely thin material layer insofar as each value of the effective resistance has associated therewith a value of the transmission-related parameter that is constant regardless of the frequency characterizing said electromagnetic radiation that passes through said uniformly resistant finitely thin material layer. According to frequent inventive practice, plural measurements are performed so as to establish a "measurement relationship," which is a relationship between the transmission-related parameter and the frequency; plural solutions are found so as to establish a "correlation relationship," which is a relationship between the effective resistance and the frequency.

The term "material layer," as used herein, broadly refers to any material configured as a layer that is situated or situatable upon a substrate, such material including but not being limited to conductor, semiconductor, or superconductor material. The terms "material layer" and "film" are used interchangeably herein.

The term "transmission-related parameter," as used herein, broadly refers to any quantifiable parameter that is indicative of an amount of electromagnetic radiation (e.g., light) that is transmitted through or is not transmitted through a medium. Examples of quantifiable transmission-related parameters include, but are not limited to, transmission loss, transmission coefficient, reflection coefficient, transmissivity, extinction coefficient, and transmittance. In the context of typical practice of the present invention, a transmission-related parameter is useful only if the following obtains: The theoretical passage of electromagnetic radiation through a uniformly resistant infinitely thin material layer is characterized by constancy of the transmission-related parameter, independent of frequency, for any given resistance.

The present invention is often practiced in such a way as to implement a computer for generating a data representation pertaining to a relationship between the resistance of a material layer and the frequency of electromagnetic radiation that passes through the material layer. An equation is stored that describes a transmission-related parameter as a function of resistance with respect to the theoretical passage of electromagnetic radiation through a uniformly resistant infinitely thin material layer, wherein the theoretical passage is characterized by constancy of the transmission-related parameter, independent of frequency, for any given resistance. Measurements are input that describe a transmission-related parameter as a function of frequency with respect to the passage of electromagnetic radiation through a material layer. The measurements are related to the equation so as to describe resistance as a function of frequency with respect to the passage of electromagnetic radiation through the material layer.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein:

FIG. 1 and FIG. 2 are identical in form;

however, FIG. 1 is representative of transmission through a uniformly resistive, infinitely thin material layer (elsewhere herein written, sans comma, as "uniformly resistive infinitely thin material layer" or, synonymously, "uniformly resistive infinitely thin film"), whereas FIG. 2 is representative of transmission through a uniformly resistive, finitely thin material layer (elsewhere herein written, sans comma, as "uniformly resistive finitely thin material layer" or, synonymously, "uniformly resistive finitely thin film"). The horizontal plots in FIG. 1 each indicate constancy of transmission coefficient of the electromagnetic radiation, irrespective of the frequency of the electromagnetic radiation, as pertains to a value of theoretical resistance characterizing a uniformly resistive infinitely thin film. The horizontal plots in FIG. 2 each indicate constancy of transmission coefficient of the electromagnetic radiation, irrespective of the frequency of the electromagnetic radiation, as pertains to a value of effective resistance characterizing a uniformly resistive finitely thin film.

FIG. 5 is, in a sense, a more concrete version of FIG. 3 insofar as values are provided for transmission coefficient and effective resistance.

FIG. 8 is representative of various tabular data representations possible in inventive practice that are foundational of, derived from or otherwise associated with graphical representations such as shown in FIG. 5, FIG. 6 and/or FIG. 7.

DETAILED DESCRIPTION OF THE INVENTION

Figure 1:
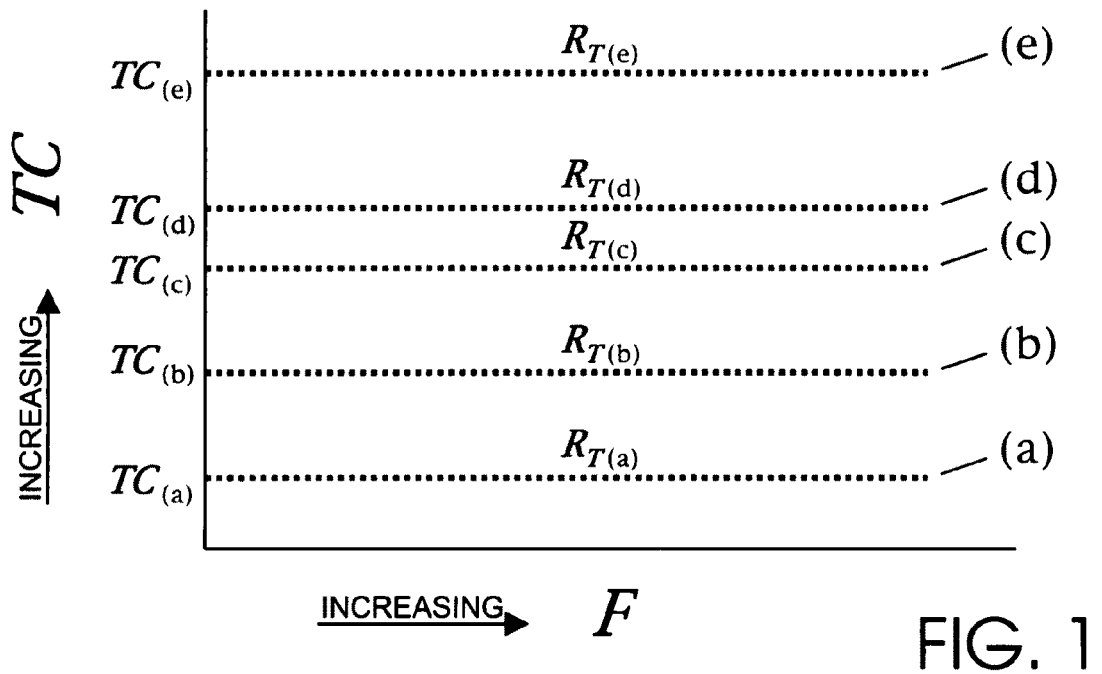
FIG. 1 is a graph conceptually illustrative of electromagnetic radiation's transmission coefficient (y-axis) versus electromagnetic radiation's frequency (x-axis) for transmission of electromagnetic radiation through a material layer of uniform theoretical resistance and infinite thinness. Each horizontal plot in FIG. 1 corresponds to a different value of material layer's theoretical resistance.

Referring now to FIG. 1, the transmission coefficient TC of electromagnetic radiation that passes through an infinitely thin film of uniform resistance in one dimension is constant as a function of the frequency F of the electromagnetic radiation. FIG. 1 shows, for illustrative purposes, plots (a) through (e) respectively corresponding to various values of theoretical uniform resistance $R_T$, viz., $R_{T(a)}$ through $R_{T(e)}$. Each plot is characterized by horizontal linearity because of the constancy of the transmission coefficient TC regardless of the frequency F. The plots vary in the constant values of TC in accordance with the varying uniform values of theoretical resistance $R_T$.

An important premise of the present invention is that a material layer of a finite thinness and a given uniform resistance behaves in approximately the same manner as does a material layer of an infinite thinness and the same uniform resistance. A uniformly resistive finitely thin film can exist in reality; a uniformly resistive infinitely thin film is strictly theoretical. The term "effective resistance" is used herein, in the context of inventive practice, to denote the resistance of a uniformly resistive finitely thin film, wherein such resistance is considered to be equivalent, in practical effect, to the resistance of a uniformly resistive infinitely thin film; that is, according to inventive principle, the effective resistance $R_E$ of a uniformly resistive finitely thin material layer is equated to the theoretical resistance $R_T$ of a uniformly resistive infinitely thin material layer. Effective resistance $R_E$ is the resistance that characterizes the electromagnetic radiation when passing through a uniformly resistive finitely thin material layer. Theoretical resistance $R_T$ is the resistance that characterizes the electromagnetic radiation when passing through a uniformly resistive infinitely thin material layer.

Figure 2:
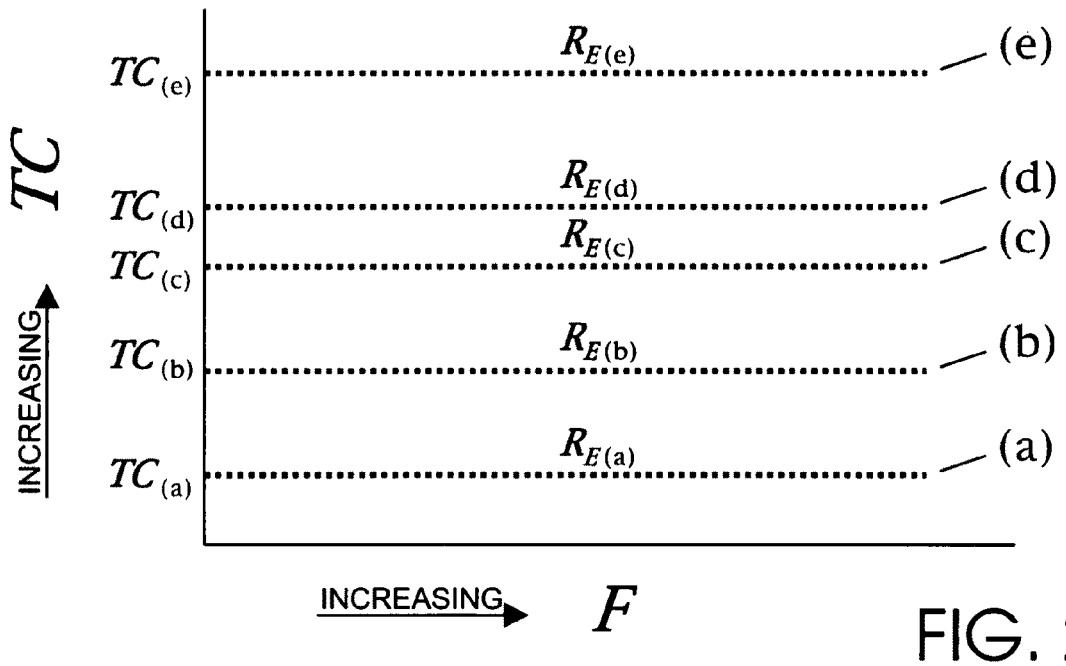
FIG. 2 is graph conceptually illustrative of electromagnetic radiation's transmission coefficient (y-axis) versus electromagnetic radiation's frequency (x-axis) for transmission of electromagnetic radiation through a material layer of uniform effective resistance and finite thinness. Each horizontal plot in FIG. 2 corresponds to a different value of material layer's effective resistance.

Reference is now made to FIG. 2, which is based on the present invention's supposition of comparable behaviors of a uniformly resistive infinitely thin film and a uniformly resistive finitely thin film. Frequency-independent constancy of transmission coefficient with respect to a uniformly resistive infinitely thin film, such as depicted in FIG. 1, translates into frequency-independent constancy of transmission coefficient with respect to a uniformly resistive finitely thin film, such as depicted in FIG. 2. In other words, the constancy of transmission coefficient, independent of frequency, of electromagnetic radiation with respect to a uniformly resistive infinitely thin film (FIG. 1) is deemed by the present invention to hold true with respect to a uniformly resistive finitely thin film (FIG. 2). FIG. 2 shows, for illustrative purposes, plots (a) through (e) respectively corresponding to various values of theoretical uniform resistance $R_E$, viz., $R_{E(a)}$ through $R_{E(e)}$. As identically shown in FIG. 1, each plot in FIG. 2 is characterized by horizontal linearity because of the constancy of the transmission coefficient TC regardless of the frequency F. The plots in FIG. 2 vary in the constant values of TC in accordance with the varying uniform values of effective resistance $R_E$.

Figure 3:
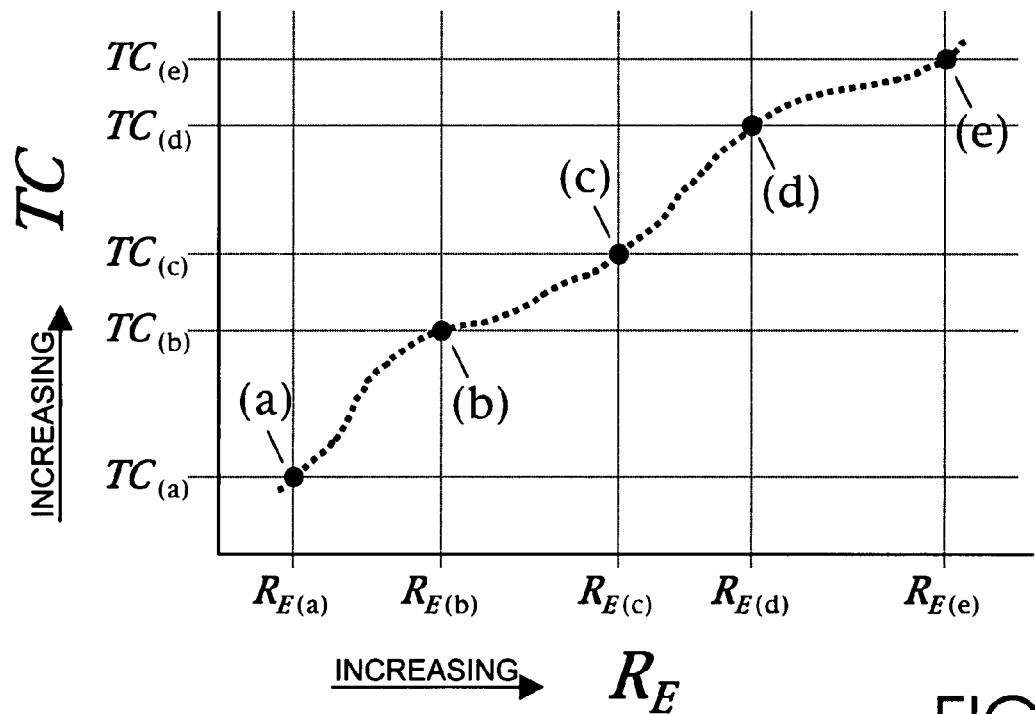
FIG. 3 is a graph conceptually illustrative of transmission coefficient (y-axis) versus material layer's effective resistance (x-axis) for transmission of electromagnetic radiation through a material layer of uniform effective resistance and finite thinness.

As illustrated in FIG. 2, the transmission coefficient of electromagnetic radiation passing through a uniformly resistive finitely thin film can be calculated for each of plural values of the effective resistance of the uniformly resistive finitely thin film. With reference to FIG. 3, a baseline relationship can be established between effective resistance $R_E$ and transmission coefficient TC. Since electromagnetic behavior relative to a uniformly resistive finitely thin material layer (such as depicted in FIG. 2) is considered by the present invention to be analogous to electromagnetic behavior relative to a uniformly resistive infinitely thin material layer (such as depicted in FIG. 1), the plot shown in FIG. 3 is described by single discrete data points. Each calculated point plotted in FIG. 3 signifies the present invention's assumption, exemplified in FIG. 2, of singularity of the transmission coefficient value of the electromagnetic radiation, irrespective of the frequency F of the electromagnetic radiation, for any given value of the effective resistance $R_E$ that characterizes the electromagnetic radiation.

The plotted data points in FIG. 3 correspond to the plotted horizontal data lines in FIG. 2. Point (a) in FIG. 3 corresponds to horizontal line (a) in FIG. 2; point (b) in FIG. 3 corresponds to horizontal line (b) in FIG. 2; point (c) in FIG. 3 corresponds to horizontal line (c) in FIG. 2; point (d) in FIG. 3 corresponds to horizontal line (d) in FIG. 2; point (e) in FIG. 3 corresponds to horizontal line (e) in FIG. 2. Accordingly, in FIG. 3 the horizontal and vertical coordinates ($R_E$, TC) of points (a), (b), (c), (d) and (e), respectively, are ($R_{E(a)}$, $TC_{(a)}$), ($R_{E(b)}$, $TC_{(b)}$), ($R_{E(c)}$, $TC_{(c)}$), ($R_{E(d)}$, $TC_{(d)}$), ($R_{E(e)}$, $TC_{(e)}$). Using conventional mathematical technique, a curve describing a mathematical equation can be fit through the plotted points in a manner such as shown in FIG. 3.

Figure 4:
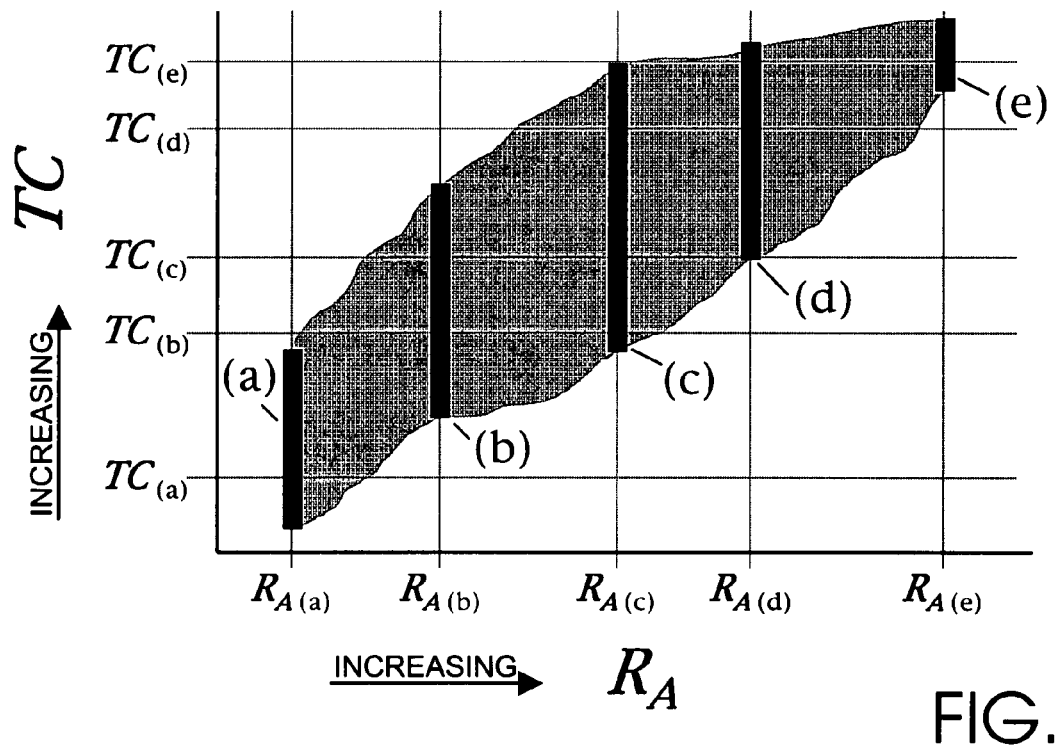
FIG. 4 is a graph conceptually illustrative of transmission coefficient (y-axis) versus material layer's actual resistance (x-axis) for transmission of electromagnetic radiation through a material layer of uniform actual resistance and finite thinness.
Figure 6:
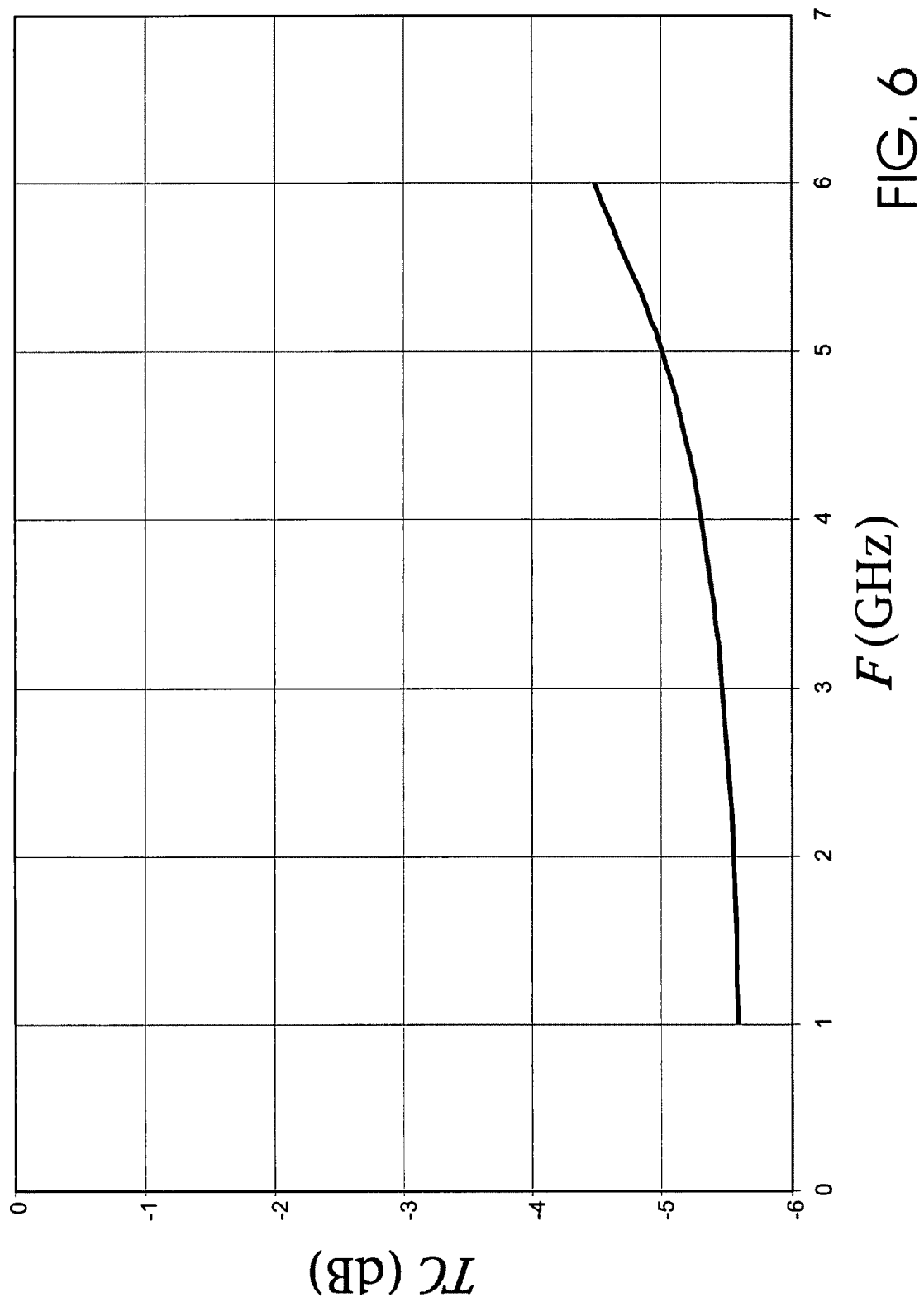
FIG. 6 is a graph illustrative, by way of numerical example, of electromagnetic radiation's transmission coefficient in decibels (y-axis) versus electromagnetic radiation's frequency in gigahertz (x-axis) for transmission of electromagnetic radiation through a material layer of uniform effective resistance and finite thinness.

In actuality, the transmission coefficient of the electromagnetic radiation that impinges upon a uniformly resistive finitely thin material layer is not independent of, but in fact varies with, the frequency of the electromagnetic radiation. With reference to FIG. 4, the transmission coefficient TC of the electromagnetic radiation consists of a range of transmission coefficient TC values, depending on the frequency F, for each value of actual resistance $R_A$ that characterizes the electromagnetic radiation. This is distinguishable from FIG. 3, in which the transmission coefficient TC of the electromagnetic radiation consists of one transmission coefficient TC value for each value of effective resistance $R_E$ that characterizes the material layer. As shown in FIG. 4, each actual resistance $R_A$ is associated with a range of transmission coefficient TC values, due to variation in transmission coefficient TC in accordance with frequency F, such as shown in FIG. 6. Each range of transmission coefficient TC values is represented by a vertical data bar in FIG. 4. (The transmission coefficient TC ranges shown in FIG. 4 are shown to be extensive for illustrative purposes.) Thus, the transmission coefficient TC ranges associated with resistances $R_{A(a)}$, $R_{A(b)}$, $R_{A(c)}$, $R_{A(d)}$ and $R_{A(e)}$, respectively, are represented by vertical bars (a), (b), (c), (d) and (e).

Still referring to FIG. 1 through FIG. 4 and also referring to FIG. 5 through FIG. 9, it is emphasized that practice of the present invention yields reasonable estimates, not exact solutions. Each calculated vertical range bar plotted in FIG. 4 signifies the present invention's recognition, exemplified in FIG. 6, of variability of the transmission coefficient value of the electromagnetic radiation in accordance with the frequency of the electromagnetic radiation, for any given value of the actual resistance $R_A$ that characterizes the material layer. Disregarding the inexactitude of a relationship between transmission coefficient TC and effective resistance $R_E$ such as that which is illustrated in FIG. 3, this relationship between transmission coefficient TC and effective resistance $R_E$ is characterized by algebraic curvilinearity, and hence is considerably more manageable mathematically than is a relationship between transmission coefficient TC and actual resistance $R_A$ such as that which is illustrated in FIG. 4.

Figure 5:
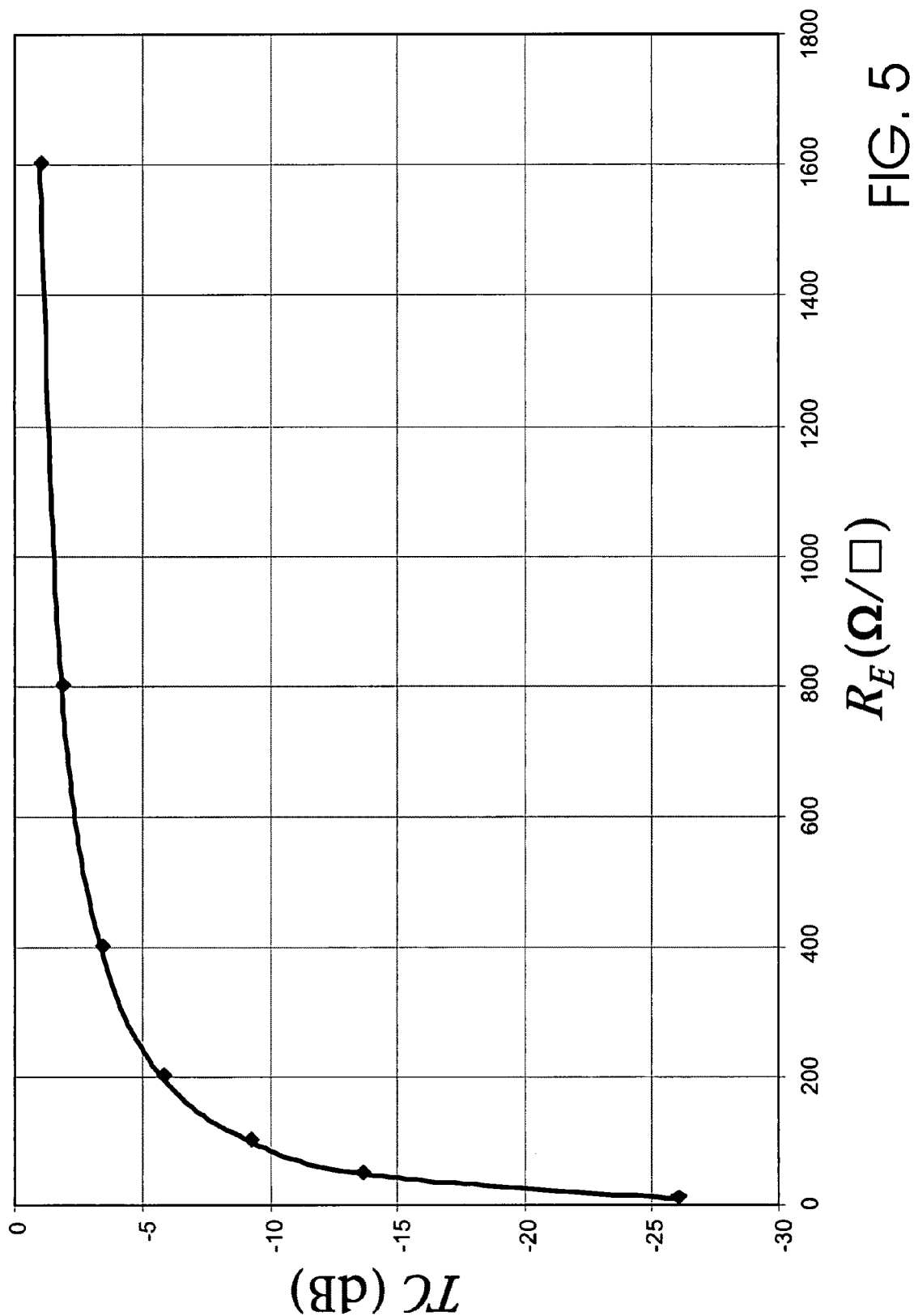
FIG. 5 is a graph, illustrative by way of numerical example, of transmission coefficient in decibels (y-axis) versus material layer's effective resistance in ohms per square (x-axis) for transmission of electromagnetic radiation through a material layer of uniform effective resistance and finite thinness.
Figure 7:
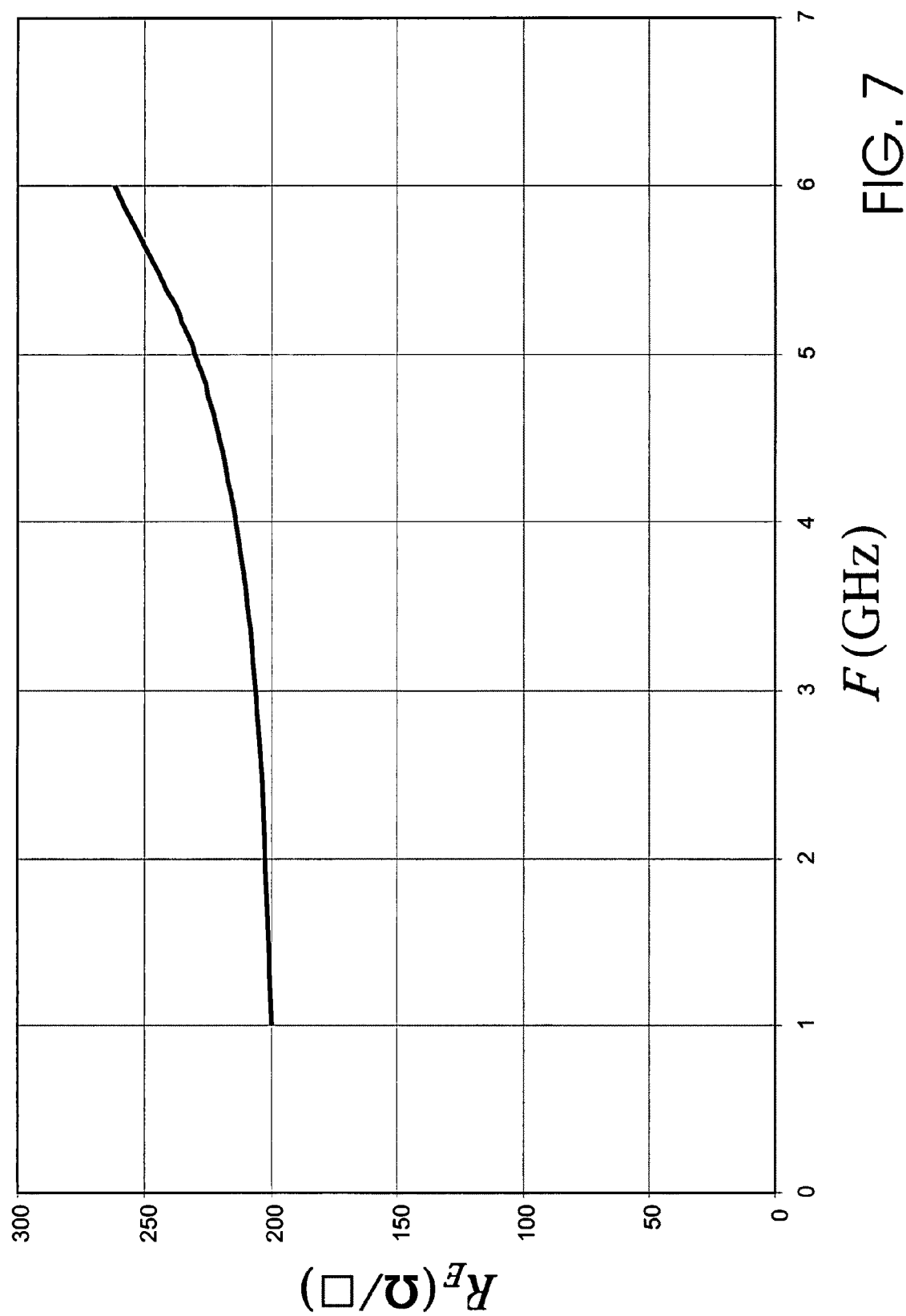
FIG. 7 is a graph illustrative, by way of numerical example, of material layer's effective resistance in ohms per square (y-axis) versus electromagnetic radiation's frequency in gigahertz (x-axis) for transmission of electromagnetic radiation through a material layer of uniform effective resistance and finite thinness.

The graphs of FIG. 5 and FIG. 7 are generally representative of some plot-forms that may be obtained through inventive practice; however, the numerical values set forth in the graphs of FIG. 5 through FIG. 7 are intended herein to be merely illustrative and without significance in and of themselves. A TC-versus-$R_E$ relationship such as shown in FIG. 3 or FIG. 5 is an essential component of typical inventive practice for determining a relationship between effective resistance $R_E$ and frequency F. A TC-versus-$R_E$ relationship such as shown in FIG. 3 or FIG. 5 can be correlated—e.g., algebraically or tabularly—with a TC-versus-F relationship such as shown in FIG. 6. The relationship shown in FIG. 6 represents measured values (in decibels) of transmission coefficient TC corresponding to various values (in gigahertz) of frequency F. By availing itself of both (i) a calculated TC-versus-$R_E$ relationship and (ii) a measured TC-versus-F relationship, the inventive methodology succeeds in bridging between effective resistance $R_E$ and frequency F via transmission coefficient TC so as to determine a relationship between effective resistance $R_E$ and frequency F. An example of an inventively determined $R_E$-versus-F relationship is illustrated in FIG. 7. Otherwise expressed, the present invention correlates two sets of functional data—viz., "theoretical" (TC-versus-$R_E$) data and "empirical" (TC-versus-F) data—to obtain a third set of functional data, namely, "correlative" ($R_E$-versus-F) data. The $R_E$-versus-F relationship is sufficiently accurate for many purposes, notwithstanding the inherently approximative nature of the TC-versus-$R_E$ relationship.

A practitioner of the present invention can exercise known technique for measuring a transmission-related parameter (e.g., transmission coefficient, reflection coefficient, transmission loss, transmissivity, extinction coefficient, or transmittance) in order to render an empirical relationship between a transmission-related parameter and the frequency of the electromagnetic radiation impinging upon a uniformly resistant finitely thing material layer. FIG. 6 is representative of such an empirical relationship in which the transmission-related parameter is transmission coefficient. As shown in FIG. 6, transmission coefficient measurements are taken for various frequencies of electromagnetic radiation passing through an existing material layer. The measurements can be taken for one value, or more than one value (e.g., several or many values), of the frequency or of the transmission-related parameter. It may be preferable that a practitioner of the present invention use known instrumentation that can simultaneously measure a transmission-related parameter for plural (e.g., multiple) frequencies or over one or more ranges of frequencies.

The present invention can be practiced using transmission coefficient or any among various other transmission-related parameters. Although examples described herein involve transmission coefficient, the ordinarily skilled artisan who reads this disclosure will understand how to practice the present invention as involving transmission coefficient or another transmission-related parameter such as reflection coefficient, transmission loss, transmissivity, extinction coefficient, or transmittance. Certain transmission-related parameters are conventionally understood to be related to certain other transmission related parameters. For instance, generally speaking with regard to conventional understanding, the sum of transmission coefficient TC and reflection coefficient RC is unity; that is, TC+RC=1. The fraction (e.g., percentage) of the intensity of incident electromagnetic radiation that is refracted by an interface is given by the transmission coefficient TC; the fraction (e.g., percentage) of the intensity of incident electromagnetic radiation that is reflected by an interface is given by the reflection coefficient RC. In the light of the instant disclosure, the ordinarily skilled artisan will appreciate that the transmission-related parameters enumerated herein and other transmission-related parameters (some of which may be related to or synonymous with transmission-related parameters enumerated herein) lend themselves to practice of the present invention.

Figures 8, 9:
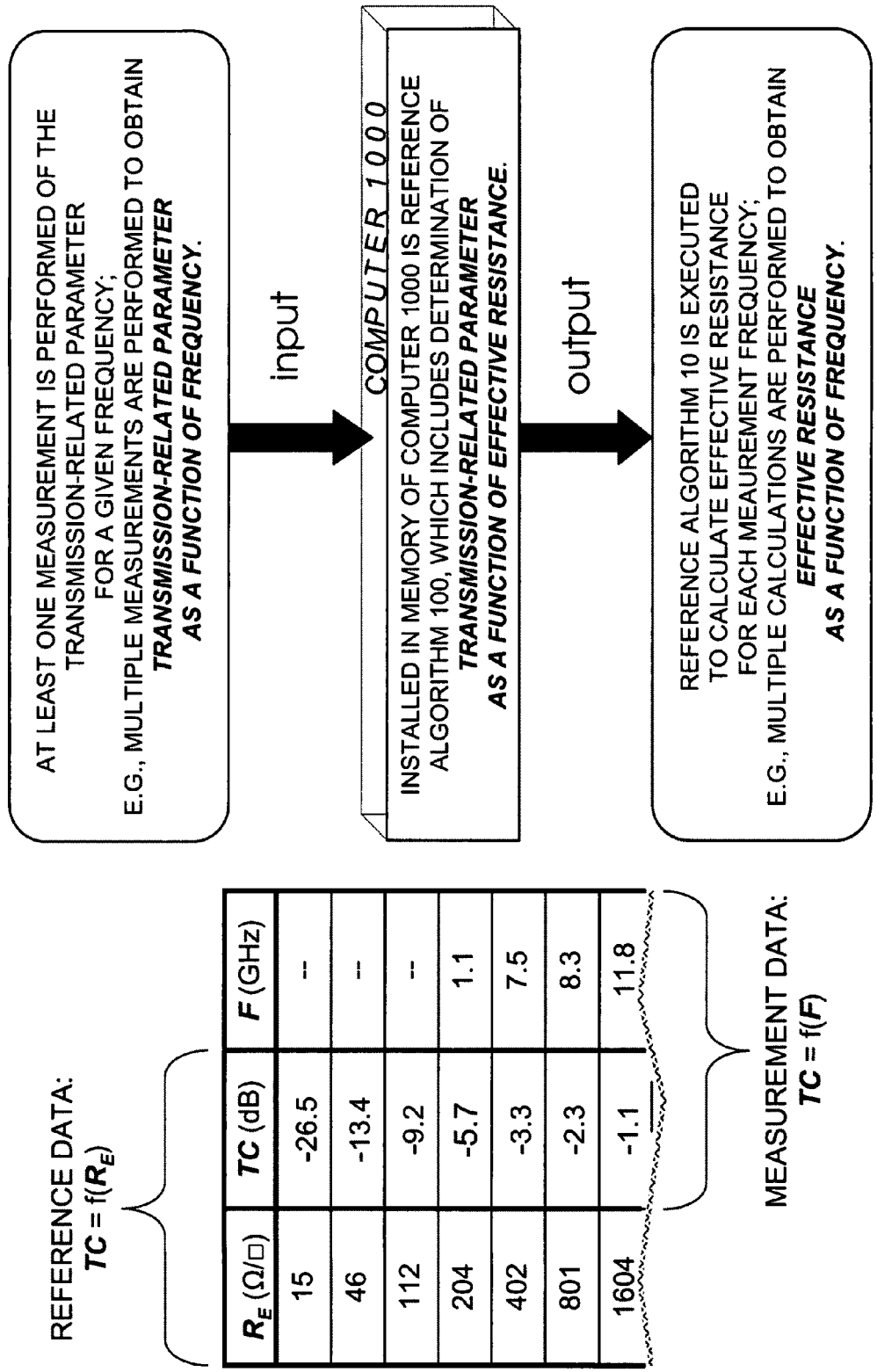
FIG. 8 is a table illustrative, by way of numerical example, of electromagnetic radiation's frequency ($3^{rd}$ column) versus electromagnetic radiation's transmission coefficient ($2^{nd}$ column) versus material layers effective resistance ($1^{st}$ column) for transmission of electromagnetic radiation through a material layer of uniform effective resistance and finite thinness. The table of FIG. 8 roughly corresponds to the graphs of FIG. 5 through FIG. 7.
FIG. 9 is a schematic of a typical embodiment of an inventive method for determining a relationship between resistance (i.e., the resistance of a uniformly resistant finitely thin material layer) and frequency (i.e., the frequency of electromagnetic radiation that impinges upon the material layer).

The present invention admits of embodiment as a method, an apparatus (e.g., comprising a machine having a memory), or a computer program product. Although a pen-and-paper approach absent computer can be taken by an inventive practitioner, more usual inventive practice provides for utilization of a computer for rendering mathematical determinations in accordance with inventive principles. A "computer" is broadly defined herein as any machine having a memory and processing capability, such as personal computer, hand-held scientific calculator, etc. A computer program product (e.g., algorithmic software) embodying one or more aspects of the present invention can reside in the memory of a computer. FIG. 9 is diagrammatically illustrative of residence, in accordance with the present invention, of a computer program product 100 in the memory of a computer 1000.

The inventive computer program product 100 can be used to generate multifarious types of information. In accordance with the present invention, empirical data such as illustrated in FIG. 6 can be associated with theoretical data such as illustrated in FIG. 3 or FIG. 5 so as to describe a relationship between resistance and frequency such as illustrated in FIG. 7. An inventive computer 1000, which has inventive computer software 100 residing (e.g., installed) in its memory, can generate various embodiments of any or all of these relationships, including but not limited to an equation, and/or a graph (such as depicted in FIG. 3, FIG. 5, FIG. 6, or FIG. 7), and/or a table (such as depicted in FIG. 8). That is, a computer such as inventive computer 1000 can be utilized to generate mathematical and/or graphical and/or tabular representations of: the theoretical (reference) data such as depicted in FIG. 3 or FIG. 5 or in the first and second columns of FIG. 8; and/or, the empirical data such as depicted in FIG. 6 or in the second and third columns of FIG. 8; and/or, the correlative data such as depicted in FIG. 7 or in the first and third columns of FIG. 8.

The term "equation" is used herein in its all-encompassing sense to mean any mathematical relationship (e.g., mathematical statement) involving equality between two mathematical entities (e.g., mathematical expressions), such as involving a functional relation between two variables. Several known mathematical techniques for finding an equation that approximates a set of data—such as involving curve-fitting, regression analysis, or least squares—can be implemented by a practitioner of the present invention in order to determine one or more equations that approximate baseline data such as depicted in FIG. 3 or FIG. 5, and/or empirical data such as depicted in FIG. 6, and/or correlation data such as depicted in FIG. 7.

Inventive computer 1000 can generate, for instance, the following: (i) a first equation, based on input data such as listed in the left (resistance) and middle (transmission coefficient) columns shown in FIG. 8, that describes a FIG. 5-*type* transmission-related-parameter-versus-resistance relationship; (ii) a second equation, based on input data such as listed in the right (frequency) and middle (transmission coefficient) columns shown in FIG. 8, that describes a FIG. 6-*type* transmission-related-parameter-versus-frequency relationship; and, (iii) a third equation, based on the first and second equations or information pertaining thereto, that describes a FIG. 7-*type* resistance-versus-frequency relationship. According to some inventive embodiments, it is a simple matter to determine the third equation by applying the mathematical principle of transitivity; that is, if a transmission-related parameter is a function of effective resistance per the first equation, and the transmission-related parameter is a function of frequency per the second equation, then it follows that effective resistance is a function of frequency (or, equivalently, frequency is a function of effective resistance) per the third equation.

In addition to or as alternative to at least one of the equations, inventive computer 1000 can generate useful graphs and/or tables corresponding to the first equation and/or the second equation and/or the third equation. For instance, inventive computer 1000 can generate a handy look-up table similar to that shown in FIG. 8 but having the data organized in small increments so as to facilitate at-a-glance determination of resistance, transmission-related parameter (e.g., transmission coefficient) and frequency values. A legibly detailed graph could accomplish a similar purpose.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications and changes to the principles disclosed herein may be made by one skilled in the art without departing from the true scope and spirit of the present invention, which is indicated by the following claims.

What is claimed is:

1. A method for determining the resistance of a material layer in accordance with the frequency of electromagnetic radiation impinging thereon, the method comprising:

establishing a reference relationship, said reference relationship being a relationship between a transmission-related parameter and effective resistance, said transmission-related parameter characterizing electromagnetic radiation that passes through a uniformly resistant finitely thin material layer, said effective resistance characterizing said uniformly resistant finitely thin material layer through which said electromagnetic radiation passes, said establishing of a reference relationship including calculating a value of said transmission-related parameter for each of plural values of said effective resistance, wherein said effective resistance is assumed to be equivalent to the theoretical resistance of a uniformly resistant infinitely thin material layer insofar as each value of said effective resistance has associated therewith a value of said transmission-related parameter that is constant regardless of the frequency characterizing said electromagnetic radiation that passes through said uniformly resistant finitely thin material layer;

performing at least one measurement of a value of said transmission-related parameter for a value of the frequency characterizing said electromagnetic radiation that passes through said uniformly resistant finitely thin material layer; and based on said reference relationship and said at least one measurement, finding at least one solution of a value of said effective resistance for a value of said frequency characterizing said electromagnetic radiation that passes through said uniformly resistant finitely thin material layer.

2. The method for determining of claim 1, wherein said performing at least one measurement is performing plural measurements, and wherein said performing plural measurements includes establishing a measurement relationship, said measurement relationship being a relationship between said transmission-related parameter and said frequency characterizing said electromagnetic radiation that passes through said uniformly resistant finitely thin material layer.

3. The method for determining of claim 1, wherein said finding at least one solution is finding plural solutions, and wherein said finding plural solutions includes establishing a correlation relationship, said correlation relationship being a relationship between said effective resistance and said frequency characterizing said electromagnetic radiation that passes through said uniformly resistant finitely thin material layer.

4. The method for determining of claim 3, wherein said performing at least one measurement is performing plural measurements, and wherein said performing plural measurements includes establishing a measurement relationship, said measurement relationship being a relationship between said transmission-related parameter and said frequency characterizing said electromagnetic radiation that passes through said uniformly resistant finitely thin material layer.

5. The method for determining of claim 1, wherein said transmission-related parameter is transmission coefficient.

6. The method for determining of claim 1, wherein said transmission-related parameter is selected from the group consisting of transmission coefficient, reflection coefficient, extinction coefficient, transmission loss, transmissivity, and transmittance.

7. A computer readable medium embodying computer program logic executable by a computer for performing a method for determining the resistance of a material layer in accordance with the frequency of electromagnetic radiation impinging thereon, said method comprising:

establishing a reference relationship, said reference relationship being a relationship between a transmission-related parameter and effective resistance, said transmission-related parameter characterizing electromagnetic radiation that passes through a uniformly resistant finitely thin material layer, said effective resistance characterizing said uniformly resistant finitely thin material layer through which said electromagnetic radiation passes, said establishing of a reference relationship including calculating a value of said transmission-related parameter for each of plural values of said effective resistance, wherein said effective resistance is assumed to be equivalent to the theoretical resistance of a uniformly resistant infinitely thin material layer insofar as each value of said effective resistance has associated therewith a value of said transmission-related parameter that is constant regardless of the frequency characterizing said electromagnetic radiation that passes through said uniformly resistant finitely thin material layer;

performing at least one measurement of a value of said transmission-related parameter for a value of the frequency characterizing said electromagnetic radiation that passes through said uniformly resistant finitely thin material layer; and based on said reference relationship and said at least one measurement, finding at least one solution of a value of said effective resistance for a value of said frequency characterizing said electromagnetic radiation that passes through said uniformly resistant finitely thin material layer.

8. The computer readable medium of claim 7, wherein said performing at least one measurement is performing plural measurements, and wherein said performing plural measurements includes establishing a measurement relationship, said measurement relationship being a relationship between said transmission-related parameter and said frequency characterizing said electromagnetic radiation that passes through said uniformly resistant finitely thin material layer.

9. The computer readable medium of claim 7, wherein said finding at least one solution is finding plural solutions, and wherein said finding plural solutions includes establishing a correlation relationship, said correlation relationship being a relationship between said effective resistance and said frequency characterizing said electromagnetic radiation that passes though said uniformly resistant finitely thin material layer.

10. The computer readable medium of claim 9, wherein said performing at least one measurement is performing plural measurements, and wherein said performing plural measurements includes establishing a measurement relationship, said measurement relationship being a relationship between said transmission-related parameter and said frequency characterizing said electromagnetic radiation that passes through said uniformly resistant finitely thin material layer.

11. The computer readable medium of claim 7, wherein said transmission-related parameter is transmission coefficient.

12. The computer readable medium of claim 7, wherein said transmission-related parameter is selected from the group consisting of transmission coefficient, reflection coefficient, extinction coefficient, transmission loss, transmissivity, and transmittance.

13. A computer readable medium embodying computer program logic executable by a computer for performing a method for determining the resistance of a material layer in accordance with the frequency of electromagnetic radiation impinging thereon, said method comprising:

establishing a reference relationship, said reference relationship being a relationship between a transmission-related parameter and effective resistance, said transmission-related parameter characterizing electromagnetic radiation that passes through a uniformly resistant finitely thin material layer, said effective resistance characterizing said uniformly resistant finitely thin material layer through which said electromagnetic radiation passes, said establishing of a reference relationship including calculating a value of said transmission-related parameter for each of plural values of said effective resistance, wherein said effective resistance is assumed to be equivalent to the theoretical resistance of a uniformly resistant infinitely thin material layer insofar as each value of said effective resistance has associated therewith a value of said transmission-related parameter that is constant regardless of the frequency characterizing said electromagnetic radiation that passes through said uniformly resistant finitely thin material layer;

inputting at least one measurement performed of a value of said transmission-related parameter for a value of the frequency characterizing said electromagnetic radiation that passes through said uniformly resistant finitely thin material layer; and based on said reference relationship and said at least one measurement, finding at least one solution of a value of said effective resistance for a value of said frequency characterizing said electromagnetic radiation that passes through said uniformly resistant finitely thin material layer.

14. The computer readable medium of claim 13, wherein said inputting at least one measurement is inputting plural measurements, and wherein said inputting plural measurements includes establishing a measurement relationship, said measurement relationship being a relationship between said transmission-related parameter and said frequency characterizing said electromagnetic radiation that passes through said uniformly resistant finitely thin material layer.

15. The computer readable medium of claim 13, wherein said finding at least one solution is finding plural solutions, and wherein said finding plural solutions includes establishing a correlation relationship, said correlation relationship being a relationship between said effective resistance and said frequency characterizing said electromagnetic radiation that passes through said uniformly resistant finitely thin material layer.

16. The computer readable medium of claim 15, wherein said inputting at least one measurement is inputting plural measurements, and wherein said inputting plural measurements includes establishing a measurement relationship, said measurement relationship being a relationship between said transmission-related parameter and said frequency characterizing said electromagnetic radiation that passes through said uniformly resistant finitely thin material layer.

17. The computer readable medium of claim 13, wherein said transmission-related parameter is transmission coefficient.

18. The computer readable medium of claim 13, wherein said transmission-related parameter is selected from the group consisting of transmission coefficient, reflection coefficient, extinction coefficient, transmission loss, transmissivity, and transmittance.

* * * * *